US012696580B2

(12) United States Patent
Wu et al.

(10) Patent No.: US 12,696,580 B2
(45) Date of Patent: Jul. 28, 2026

(54) GROUP III-NITRIDE EXCITONIC HETEROSTRUCTURES

(71) Applicant: The Regents of the University of Michigan, Ann Arbor, MI (US)

(72) Inventors: Yuanpeng Wu, Ann Arbor, MI (US); Zetian Mi, Ann Arbor, MI (US)

(73) Assignee: The Regents of the University of Michigan, Ann Arbor, MI (US)

( * ) Notice: Subject to any disclaimer, the term of this patent is extended or adjusted under 35 U.S.C. 154(b) by 993 days.

(21) Appl. No.: 17/788,633

(22) PCT Filed: Dec. 23, 2020

(86) PCT No.: PCT/US2020/066849
§ 371 (c)(1),
(2) Date: Jun. 23, 2022

(87) PCT Pub. No.: WO2021/133910
PCT Pub. Date: Jul. 1, 2021

(65) Prior Publication Data
US 2023/0033526 A1    Feb. 2, 2023

Related U.S. Application Data

(60) Provisional application No. 62/953,325, filed on Dec. 24, 2019.

(51) Int. Cl.
*H01L 33/06* (2010.01)
*H01L 33/00* (2010.01)
(Continued)

(52) U.S. Cl.
CPC .... *H10H 20/812* (2025.01); *H10H 20/01335* (2025.01); *H10H 20/813* (2025.01);
(Continued)

(58) Field of Classification Search
CPC .. H10H 20/812; H10H 20/821; H10H 20/813; H10H 20/8252; H10H 20/01335; H10H 20/032
See application file for complete search history.

(56) References Cited

U.S. PATENT DOCUMENTS 6,881,983 B2    4/2005  Narayan et al.
2004/0219702 A1*  11/2004  Nagai ............... H01L 21/02579
438/46
(Continued)

FOREIGN PATENT DOCUMENTS

JP    2000216432 A    8/2000
KR    20110035395 A    4/2011

OTHER PUBLICATIONS

Rejection Decision in Chinese Patent Application No. 202080094741.4, dated Sep. 24, 2025, 21 pages (including English translation).
(Continued)

*Primary Examiner* — Peniel M Gumedzoe
(74) *Attorney, Agent, or Firm* — Lempia Summerfield Katz LLC

(57) ABSTRACT

A device includes a substrate, and a plurality of structures supported by the substrate, each structure of the plurality of structures including a Group III-nitride base, first and second Group III-nitride charge carrier injection layers supported by the Group III-nitride base, and a quantum heterostructure disposed between the first and second charge carrier injection layers. The quantum hetero structure includes a pair of Group III-nitride barrier layers, and a Group III-nitride active layer disposed between the pair of Group III-nitride barrier layers. The Group III-nitride active layer has a thickness for quantum confinement of charge carriers. At least one of the pair of Group III-nitride barrier layers has a nitride surface adjacent to the Group III-nitride active layer.

13 Claims, 6 Drawing Sheets

(51) Int. Cl.
| | |
|---|---|
| *H01L 33/08* | (2010.01) |
| *H01L 33/24* | (2010.01) |
| *H01L 33/32* | (2010.01) |
| *H10H 20/01* | (2025.01) |
| *H10H 20/812* | (2025.01) |
| *H10H 20/813* | (2025.01) |
| *H10H 20/821* | (2025.01) |
| *H10H 20/825* | (2025.01) |

(52) U.S. Cl.
CPC ...... *H10H 20/821* (2025.01); *H10H 20/8252* (2025.01); *H10H 20/032* (2025.01)

(56) References Cited

U.S. PATENT DOCUMENTS

| | | | |
|---|---|---|---|
| 2014/0117307 A1 | 5/2014 | Herner et al. | |
| 2014/0167089 A1 | 6/2014 | Edmond et al. | |
| 2017/0323788 A1 | 11/2017 | Mi | |
| 2018/0261455 A1 | 9/2018 | Ooi | |
| 2018/0277715 A1 | 9/2018 | Ma et al. | |
| 2019/0013440 A1 | 1/2019 | Chowdhury | |

OTHER PUBLICATIONS

Hardy et al., "Plasma-assisted Molecular Beam Epitaxy of N-polar InAlN-barrier High-electron-mobility Transistors", Journal of Visualized Experiments, Nov. 24, 2016, 8 pages.
International Search Report and Written Opinion of the International Searching Authority in International Patent Application No. PCT/US2020/066849, dated Mar. 18, 2021, 9 pages.
Islam et al., "MBE-grown 232-270 nm deep-UV LEDs using monlayer thin binary GaN/AlN quantum heterostructures", Applied Physics Letters 110, 0481108, 2017, 5 pages.
Wu et al., "Molecular beam epitaxy and characterization of AlGaN nanowire ultraviolet light emitting diodes on Al coated Si (0 0 1) substrate", Journal of Crystal Growth 507, 2019, pp. 65-69.
A. Pandey et al.; Effect of electron blocking layer on the efficiency of AlGaN mid-ultraviolet light emitting diodes; Opt. Express 27, A738; 2019.
A. T. Connie et al.; Optical and electrical properties of Mg-doped AlN nanowires grown by molecular beam epitaxy; Appl. Phys. Lett. 106, 213105; 2015.
A. T. Sarwar et al.; Ultrathin GaN quantum disk nanowire LEDs with sub-250 nm electroluminescence; Nanoscale 8, 8024; 2016.
B. Janjua et al.; Self-planarized quantum-disks-in-nanowires ultraviolet-B emitters utilizing pendeo-epitaxy; Nanoscale 9, 7805; 2017.
C. Liu et al.; 234 nm and 246 nm AlN-Delta-GaN quantum well deep ultraviolet light-emitting diodes; Appl Phys. Lett. 112, 011101; 2018.
C. Liu et al.; Physics and polarization characteristics of 298 nm AlN-delta-GaN quantum well ultraviolet light-emitting diodes; Appl. Phys. Lett. 110, 071103; 2017.
D. Bayerl et al.; Deep ultraviolet emission from ultra-thin GaN/AlN heterostructures; Appl. Phys. Lett. 109, 241102; 2016.
D. Bayerl et al.; Room-temperature stability of excitons and transverse-electric polarized deep-ultraviolet luminescence in atomically thin GaN quantum wells; Appl. Phys. Lett. 115, 131101; 2019.
D. Li et al.; AlGaN photonics: recent advances in materials and ultraviolet devices; Adv. Opt. Photonics 10, 43; 2018.
D. Ma et al.; Exciton emission of quasi-2D InGaN in GaN matrix grown by molecular beam epitaxy; Sci. Rep. 7, 46420; 2017.
European Search Report cited in corresponding European patent application No. 20908097.7; Jan. 30, 2024; 9 pp.
H. Hirayama et al.; Recent progress and future prospects of AlGaN-based high-efficiency deep-ultraviolet light-emitting diodes; Jpn. J. Appl. Phys. 53, 100209; 2014.
H. Hirayama; Recent progress of 220-280 nm-band AlGaN based deep-UV LEDs; Proc. SPIE vol. 7617, 76171G; 2010.

H. Miyake et al.; Preparation of high-quality AlN on sapphire by high-temperature face-to-face annealing; J. Cryst. Growth 456, 155; 2016.
I. Bryan et al.; Doping and compensation in Al-rich AlGaN grown on single crystal AlN and sapphire by MOCVD; Appl. Phys. Lett. 112, 062102; 2018.
International Preliminary Report of Patentability of the International Bureau in International Patent Application No. PCT/US2020/066849, dated Jun. 28, 2022, 7 pages.
J. F. Muth et al.; Absorption coefficient, energy gap, exciton binding energy, and recombination lifetime of GaN obtained from transmission measurements; Appl. Phys. Lett. 71, 2572; 1997.
J. Li et al., Enhancing the light extraction of AlGaN-based ultraviolet light-emitting diodes in the nanoscale; J. Nanophotonics 12, 4, 043510; 2018.
J. Verma et al.; Tunnel-injection GaN quantum dot ultraviolet light-emitting diodes; Appl. Phys. Lett. 102, 041103; 2013.
J. Verma et al.; Tunnel-injection quantum dot deep-ultraviolet light-emitting diodes with polarization-induced doping in III-nitride heterostructures; Appl. Phys. Lett. 104, 021105; 2014.
K. Ding et al.; Status of Growth of Group III-Nitride Heterostructures for Deep Ultraviolet Light-Emitting Diodes; Crystals 7, 300; 2017.
K. Hestroffer et al.; Polarity of GaN nanowires grown by plasma-assisted molecular beam epitaxy on Si (111); Phys. Rev. B 84, 245302; 2011.
M. Djavid et al.; Enhancing the light extraction efficiency of AlGaN deep ultraviolet light emitting diodes by using nanowire structures; Appl. Phys. Lett. 108, 051102; 2016.
M. G. Kibria et al.; Atomic-Scale Origin of Long-Term Stability and High Performance of p-GaN Nanowire Arrays for Photocatalytic Overall Pure Water Splitting; Adv. Mater. 28, 8388; 2016.
N. H. Tran et al.; On the mechanism of highly efficient p-type conduction of Mg-doped ultra-wide-bandgap AlN nanostructures; Appl. Phys. Lett. 110, 032102; 2017.
R. Dalmau et al.; Growth and characterization of AlN and AlGaN epitaxial films on AlN single crystal substrates; J. Electrochem. Soc. 158, H530; 2011.
R. P. Smith et al.; Extraction of Many-Body Configurations from Nonlinear Absorption in Semiconductor Quantum Wells; Phys. Rev. Lett. 104, 247401; 2010.
S. Chatterjee et al.; Excitonic Photoluminescence in Semiconductor Quantum Wells: Plasma versus Excitons; Phys. Rev. Lett. 92, 067402; 2004.
S. Hagedorn et al.; AlN growth on nano-patterned sapphire: A route for cost efficient pseudo substrates for deep UV LEDs: AlN growth on nano-patterned sapphire; Phys. Status Solidi A 213, 3178; 2016.
S. M. Islam et al.; Deep-UV emission at 219 nm from ultrathin MBE GaN/AlN quantum heterostructures; Appl. Phys. Lett. 111, 091104; 2017.
S. M. Islam et al.; Sub-230 nm deep-UV emission from GaN quantum disks in AlN grown by a modified Stranski-Krastanov mode; Jpn. J. Appl. Phys. 55, 05ff06; 2016.
S. M. Sadaf et al; An AlGaN Core-Shell Tunnel Junction Nanowire Light-Emitting Diode Operating in the Ultraviolet-C Band; Nano Lett. 17, 1212; 2017.
S. Walde et al.; Impact of intermediate high temperature annealing on the properties of AlN/sapphire templates grown by metalorganic vapor phase epitaxy; Jpn. J. Appl. Phys. 58, Sc1002; 2019.
S. Zhao et al.; An electrically pumped 239 nm AlGaN nanowire laser operating at room temperature; Appl. Phys. Lett. 109, 191106; 2016.
S. Zhao et al.; III-Nitride nanowire optoelectronics; Prog. Quant. Electron. 44, 14-68; 2015.
S. Zhao et al.; Sub-milliwatt AlGaN nanowire tunnel junction deep ultraviolet light emitting diodes on silicon operating at 242 nm; Appl. Phys. Lett. 109, 201106; 2016.
S. Zhao et al.; Surface Emitting, High Efficiency Near-Vacuum Ultraviolet Light Source with Aluminum Nitride Nanowires Monolithically Grown on Silicon; Nano Lett. 15, 7006; 2015.
X. Hai et al.; Effect of low hole mobility on the efficiency droop of AlGaN nanowire deep ultraviolet light emitting diodes; Appl. Phys. Lett. 114, 101104; 2019.

(56)          References Cited

OTHER PUBLICATIONS

X. Liu et al.; Improving the efficiency of transverse magnetic polarized emission from AlGaN based LEDs by using nanowire photonic crystal; IEEE Photon. J. 10, 4, 2018.

X. Liu et al.; Molecular beam epitaxial growth and characterization of AlN nanowall deep UV light emitting diodes; Appl. Phys. Lett. 111, 101103; 2017.

X. Liu et al.; Selective area epitaxy of AlGaN nanowire arrays across nearly the entire compositional range for deep ultraviolet photonics; Opt. Express 25, 30494; 2017.

X. Rong et al.; High-Output-Power Ultraviolet Light Source from Quasi-2D GaN Quantum Structure; Adv. Mater. 28, 7978; 2016.

Y. Horikoshi et al.; Migration-Enhanced Epitaxy of GaAs and AlGaAs; Jpn. J. Appl. Phys. 27, 169; 1988.

Y. Wang et al.; Deep Ultraviolet Light Source from Ultrathin GaN/AlN MQW Structures with Output Power Over 2 Watt; Adv. Opt. Mater. 7, 1801763; 2019.

Y. Wu et al.; High efficiency single Ag nanowire/p-GaN substrate Schottky junction-based ultraviolet light emitting diodes; Appl. Phys. Lett. 106, 051108; 2015.

Y. Zhang et al.; Recent progress of tunnel junction-based ultra-violet light emitting diodes; Jpn. J. Appl. Phys. 58, Sc0805; 2019.

Y. Zhang et al.; Tunnel-injected sub-260 nm ultraviolet light emitting diodes; Appl. Phys. Lett. 110, 201102; 2017.

Z. Chen et al.; Study of AlN based materials grown on nano-patterned sapphire substrates for deep ultraviolet LED applications; Jpn J. Appl. Phys. 58, Sc1007; 2019.

Z. Mi et al.; Molecular beam epitaxial growth and characterization of Al(Ga)N nanowire deep ultraviolet light emitting diodes and lasers; J. Phys. D: Appl. Phys. 49, 364006; 2016.

Second Office Action in Chinese Patent Application No. 202080094741. 4, dated Jun. 28, 2025, 25 pages (including English translation).

First Office Action in Chinese Patent Application No. 202080094741. 4, dated Feb. 8, 2025, 26 pages (including English translation).

* cited by examiner

GROUP III-NITRIDE EXCITONIC HETEROSTRUCTURES

CROSS-REFERENCE TO RELATED APPLICATION

This U.S. National Phase application is based on International Application No. PCT/US2020/066849, filed Dec. 23, 2020, which claims the benefit of U.S. provisional application entitled "Group III-Nitride Excitonic Hetero-structures," filed Dec. 24, 2019, and assigned Ser. No. 62/953,325, the entire disclosures of which are hereby expressly incorporated by reference. Priority benefit of these earlier filed applications is hereby claimed.

STATEMENT REGARDING FEDERALLY SPONSORED RESEARCH OR DEVELOPMENT

This invention was made with government support under Contract No. W911NF19P0025 awarded by the U.S. Army Research Office and under Contract No. DMR-0723032 awarded by the National Science Foundation. The government has certain rights in the invention.

BACKGROUND OF THE DISCLOSURE

Field of the Disclosure

The disclosure relates generally to quantum-well hetero-structures for light emitting diode (LED) and other devices.

Brief Description of Related Technology

Group III-nitride ultraviolet (UV) light-emitting diodes (LEDs) are useful in a broad range of applications such as sterilization, water purification, medical treatment, and Raman spectroscopy. AlGaN quantum wells (QWs) with a high Al content have been investigated as active regions for deep UV LEDs with wavelengths ranging from 222 nm to 350 nm. To date, however, the efficiency of AlGaN deep UV LED devices is significantly below than that of GaN-based blue LED devices. For example, for LEDs operating at below 240 nm, the reported external quantum efficiency (EQE) is well below 1%. Some of the major factors limiting the performance of deep UV LEDs include low quantum efficiency due to the large densities of defects and disloca-tions in planar AlGaN QW LED heterostructures, poor charge carrier (hole) injection efficiency due to the ineffi-cient p-type conduction associated with the very large ion-ization energy of Mg dopants, and low light extraction efficiency caused by the light absorption and optical polar-ization. When the Al composition in the AlGaN active region exceeds about 68%, the crystal split-off (CH) sub-band is positioned at the top of the valence band. The hole population in the CH sub-band leads to transverse-magnetic (TM) optical transition, which is polarized along the c-axis (growth direction) and therefore prevents efficient light extraction in a conventional planar LED device. Other factors, such as electron overflow, Auger recombination, and heating effects may also contribute to the low efficiency of deep UV LED devices.

Semiconductors with an exciton binding energy larger than room temperature thermal energy is highly desired for quantum technologies. Conventional semiconductors often have an exciton energy well below room temperature ther-mal energy. Current approaches to realize a large exciton binding energy are based on monolayer transition metal dichalcogenides (TMD). However, there have been no dem-onstrated methods to synthesize these TMD materials with good quality.

The exciton binding energy of conventional bulk GaN is in the range of 20-30 meV. It is possible to significantly enhance the exciton binding energy by growing monolayer GaN. Previous attempts, however, have failed to demon-strate monolayer GaN with a large exciton binding energy, due to limitations presented by the growth process, the presence of large densities of defects and dislocations, and/or interface roughness.

SUMMARY OF THE DISCLOSURE

In accordance with one aspect of the disclosure, a device includes a substrate, and a plurality of structures supported by the substrate, each structure of the plurality of structures including a Group III-nitride base, first and second Group III-nitride charge carrier injection layers supported by the Group III-nitride base, and a quantum heterostructure dis-posed between the first and second charge carrier injection layers. The quantum heterostructure includes a pair of Group III-nitride barrier layers, and a Group III-nitride active layer disposed between the pair of Group III-nitride barrier layers. The Group III-nitride active layer has a thickness for quan-tum confinement of charge carriers. At least one of the pair of Group III-nitride barrier layers has a nitride surface adjacent to the Group III-nitride active layer.

In accordance with yet another aspect of the disclosure, a method of fabricating an excitonic device includes growing Group III-nitride bases of an array of structures on a substrate, growing a first Group III-nitride charge carrier injection layer on each Group III-nitride base of the array of structures, growing a quantum heterostructure on each first Group III-nitride charge carrier injection layer of the array of structures, and growing a second Group III-nitride charge carrier injection layer on each quantum heterostructure of the array of the structures. Growing the quantum hetero-structures includes growing a Group III-nitride barrier layer with a nitride surface, and growing a Group III-nitride active layer on the nitride surface. The Group III-nitride active layer has a thickness for quantum confinement of charge carriers.

In connection with any one of the aforementioned aspects, the devices and/or methods described herein may alterna-tively or additionally include or involve any combination of one or more of the following aspects or features. The nitride surface is free of a Group III element of which the pair of Group III-nitride barrier layers are composed. The thickness of the Group III-nitride active layer is configured for exci-tonic charge carrier recombination. The thickness of the Group III-nitride active layer corresponds with a monolayer of a Group III-nitride material of which the Group III-nitride active layer is composed. The thickness of the Group III-nitride active layer corresponds with a bilayer of a Group III-nitride material of which the Group III-nitride active layer is composed. The Group III-nitride active layer has a countable number of monolayers of a Group III-nitride material of which the Group III-nitride active layer is composed. The quantum heterostructure further includes a further Group III-nitride barrier layer, and a further Group III-nitride active layer disposed between the further Group III-nitride barrier layer and one of the pair of Group III-nitride barrier layers. Each Group III-nitride barrier layer of the pair of Group III-nitride barrier layers has a thickness that corresponds with a countable number of monolayers of a Group III-nitride material of which the pair of Group III-nitride barrier layers is composed. The Group III-nitride active layer includes gallium nitride. The pair of Group III-nitride barrier layers include aluminum nitride. The first and second Group III-nitride charge carrier injection layers include silicon-doped aluminum nitride and magnesium-doped aluminum nitride, respectively. The Group III-nitride base includes gallium nitride. Each structure of the plurality of structures includes a nanowire oriented perpendicularly to the substrate. The substrate includes silicon. Growing the Group III-nitride barrier layer with the nitride surface includes closing, at an end of a growth period, a shutter for a Group III material while leaving a shutter for nitrogen open for a length of time to consume extra Group III atoms at the surface of the Group III-nitride barrier layer. The length of time is at least on the order of minutes. The method further includes depositing a metal contact on a backside of the substrate. The method further includes growing a contact layer on each second Group III-nitride charge carrier injection layer of the array of structures.

BRIEF DESCRIPTION OF THE DRAWING FIGURES

For a more complete understanding of the disclosure, reference should be made to the following detailed description and accompanying drawing figures, in which like reference numerals identify like elements in the figures.

Figure 1:
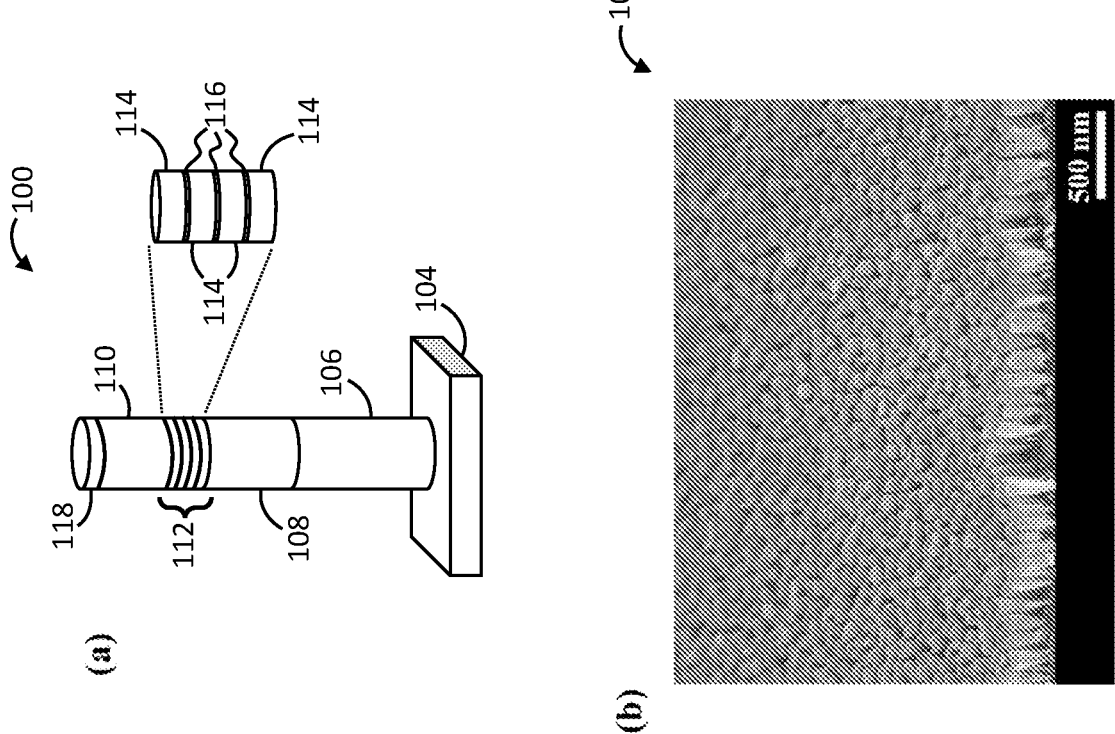
FIG. 1 depicts a schematic, perspective view of a nanowire-based device having an excitonic heterostructure in accordance with one example, as well as an image of an array of such nanowires in accordance with one example.

The embodiments of the disclosed devices and methods may assume various forms. Specific embodiments are illustrated in the drawing and hereafter described with the understanding that the disclosure is intended to be illustrative. The disclosure is not intended to limit the invention to the specific embodiments described and illustrated herein.

DETAILED DESCRIPTION OF THE DISCLOSURE

Group III-nitride devices having an excitonic heterostructure are described. Methods of fabricating the Group III-nitride devices having an excitonic heterostructure are also described. The excitonic heterostructures may include one or more monolayers of a Group III-nitride material, such as Gallium nitride (GaN). The monolayers may be embedded or otherwise disposed in a Group III-nitride nanowire, other nanostructure, or other structure. Challenges encountered in previous attempts to incorporate monolayer GaN in planar structures, such as other AlN planar structures, are thus avoided. Molecular beam epitaxy-based techniques are described for the formation of the GaN monolayer(s). In some cases, the techniques may embed or otherwise dispose the monolayer(s) in N-polar AlN nanowire structures.

The excitonic heterostructures of the nanostructure-based devices may be useful for realizing ultraviolet (UV) light emitting diode (LED) devices, such as deep UV LED devices. In some examples, deep ultraviolet emissions from 4.85 to 5.25 eV were measured by varying AlN barrier thickness. Detailed optical measurements and direct correlation with first-principles calculations based on density functional and many-body perturbation theory suggest that charge carrier recombination occurs predominantly via excitons in the extremely confined monolayer heterostructures (e.g., GaN/AlN heterostructures), with an exciton binding energy exceeding, e.g., 200 meV. Examples of deep ultraviolet LED devices having single and double monolayer GaN are configured to operate at 238 and 270 nm, respectively. These unique deep ultraviolet LEDs exhibit highly stable emission and a small turn on voltage around 5 V.

One or more monolayers of Group III-nitrides, such as GaN, embedded in a Group III-nitride (e.g., AlN) matrix are capable of exhibiting transverse-electric (TE), instead of transverse-magnetic (TM), polarized emission in deep UV wavelengths. The extreme quantum-confinement also leads to a very large exciton binding energy (up to 230 meV) and stable excitonic emission in a monolayer GaN LED device, due to the strong Coulombic interaction, which may greatly minimize the effect of non-radiative Shockley-Read-Hall recombination. Moreover, due to the enhanced radiative recombination (smaller carrier lifetime), charge carrier densities in the device active region are significantly smaller than in a conventional LED device under otherwise identical injection current, thereby reducing non-radiative Auger recombination and electron overflow of a deep UV LED device.

In past investigations involving monolayer GaN incorporated in planar AlN structures, a large exciton binding energy in monolayer GaN was not measured. Significant surface/interface roughness and large densities of defects and dislocation in conventional planar AlGaN heterostructures on sapphire were limiting factors. In contrast, Group III-nitride nanocrystals, including nanowires and nanorods, are largely free of dislocations due to the efficient surface strain relaxation. The controlled epitaxy of monolayer GaN in AlN nanocrystals has nonetheless remained elusive. For instance, significant thickness fluctuations have been observed in monolayer GaN embedded in AlN nanowires, leading to optical emission varying from about 240 to 320 nm. The incorporation of monolayers and other atomically thin layers in a nanostructure has thus been challenging.

The disclosed methods use plasma-assisted molecular beam epitaxy (MBE) to form monolayer Group III-nitride (e.g., GaN) in N-polar Group III-nitride (e.g., AlN) nanowire arrays. As described herein, for example, growth interruption and migration enhanced epitaxy are used to control the formation of monolayer GaN in an AlN matrix. Deep UV emission from 4.9 to 5.25 eV was measured by varying AlN barrier thickness. Direct correlation with the calculated electronic and optical bandgap of monolayer GaN verifies a strong excitonic emission from monolayer GaN embedded in an AlN matrix, with an exciton binding energy exceeding 200 meV. In this manner, large-area LED devices may be formed via the incorporation of single-monolayer and double-monolayer Group III-nitride (e.g., GaN) active regions, which exhibit strong emission at 238 nm and 270 nm, respectively.

Although described herein in connection with LED devices, the excitonic heterostructures described herein are useful in connection with a wide variety of devices. For instance, the heterostructures may be used in various non-emissive devices, such as detectors. Moreover, other types of emissive devices may also be formed, including, for instance, various types of laser devices.

Although described in connection with aluminum nitride (AlN) barrier layers and GaN active layers, the disclosed devices and methods may use other Group III-nitride materials. For example, the active layers may be composed of, or otherwise include, indium nitride (InN) or InGaN. The composition of the layers of the nanostructures (or the quantum heterostructures thereof) may also vary. For instance, the composition of the barrier layers may gradually change (e.g., from AlN to GaN or vice versa) at an interface with one of the charge carrier injection layers. The barrier layers may be composed of, or otherwise include, AlGaN or, if InN is used for the active layer, GaN or InGaAlN.

Part (a) of FIG. 1 depicts a schematic illustration of a structure 100 having a quantum heterostructure in accordance with one example. As described herein, the quantum heterostructure includes a monolayer, Group III-nitride (e.g., GaN) active region. In some cases, the structure 100 constitutes a part of an LED device, such as a deep UV LED device. For instance, the device may include multiple instances of the structure 100 in an array. Part (b) of FIG. 1 depicts a scanning electron microscopy (SEM) image 102 (described below) of a device having an array or other plurality of structures in accordance with one example. Each one of the structures may have a quantum heterostructure and be otherwise configured in accordance with the structure 100, as described herein.

As shown in FIG. 1, the device includes a substrate 104 that supports each structure 100. The substrate 104 may be composed of, or otherwise include, silicon. Additional or alternative materials may be included. In this example, the silicon is n-type doped. The doping profile may vary in other cases. For instance, the substrate 104 may be p-type doped, or otherwise include p-type doping, in cases in which the dopant polarities in the structure 100 are reversed.

Each structure 100 includes a Group III-nitride base 106, lower and upper Group III-nitride charge carrier injection layers 108, 110 supported by the Group III-nitride base 106, and a quantum heterostructure 112 disposed between the first and second charge carrier injection layers 108, 110. As depicted in FIG. 1, the Group III-nitride base 106 may be in contact with the substrate 104 and the lower Group III-nitride charge carrier injection layer 108. The lower and upper Group III-nitride charge carrier injection layers 108, 110 may be in contact with opposite ends of the quantum heterostructure 112. In this example, the Group III-nitride base 106 is n-type doped, the lower Group III-nitride charge carrier injection layer 108 is n-type doped, and the upper Group III-nitride charge carrier injection layer 110 is p-type doped. Each structure 100 may also include a Group III-nitride contact layer 118 supported by, and in contact with, the upper Group III-nitride charge carrier injection layer 110. In this example, the Group III-nitride contact layer 118 is p-type doped. The dopant polarities of the aforementioned layers may be reversed in other cases. For instance, in some cases, the dopant polarities of the layers may be reversed in accordance with a different doping polarity (e.g., p-type) of the substrate 104. The composition or nature of metal contacts of the device in such cases may vary accordingly. In other cases, the dopant polarities of the layers may be reversed via the incorporation of one or more tunnel junctions in the structure 100.

The quantum heterostructure 112 includes one or more pairs of Group III-nitride barrier layers 114, and a Group III-nitride active layer 116 disposed between each pair of Group III-nitride barrier layers 114. The Group III-nitride barrier layers 114 and the Group III-nitride active layer 116 may be in contact with one another and disposed in a stacked arrangement as shown. In the example of FIG. 1, four Group III-nitride barrier layers 114 are provided to establish a stacked arrangement of three pairs. Disposed between each one of the three pairs is a respective one of the active layers 116. As a result, in this example, the quantum heterostructure 112 includes three Group III-nitride active layers 116. The number of barrier layers 114 and active layers 116 may be greater or lesser in other cases. For instance, in one example, a single pair of barrier layers 114 may be provided, along with a single active layer 116. In another example, the heterostructure 112 includes three barrier layers 114 and two active layers 116.

In some cases, each Group III-nitride active layer 116 is composed of, or otherwise includes, gallium nitride. In some cases, each Group III-nitride barrier layer 114 is composed of, or otherwise includes, aluminum nitride. The lower and upper Group III-nitride charge carrier injection layers 108, 110 may be composed of, or otherwise include, aluminum nitride (AlN). The AlN of the lower Group III-nitride charge carrier injection layer 108 may be doped with silicon. The AlN of the upper Group III-nitride charge carrier injection layer 110 may be doped with magnesium. The Group III-nitride base 106 is composed of, or otherwise includes, gallium nitride. Alternative or additional Group III-nitride materials may be used in any one or more of the above-referenced layers.

Each structure 100 may be or include a nanostructure. In the example of FIG. 1, each structure 100 of the plurality of structures is configured as, or otherwise includes, a nanowire or nanorod oriented perpendicularly to the substrate 104. The dimensions, shape, cross-sectional shape, and other characteristics of the structures 100 may vary. For instance, each structure 100 may be or include a microstructure.

Each Group III-nitride active layer 116 has a thickness for quantum confinement of charge carriers. For instance, the thickness of the Group III-nitride active layer 116 may be configured for excitonic charge carrier recombination. In some cases, the thickness of the Group III-nitride active layer 116 corresponds with a monolayer of a Group III-nitride material of which the Group III-nitride active layer 116 is composed. In other cases, the thickness of the Group III-nitride active layer 116 corresponds with a bilayer (i.e., two monolayers) of a Group III-nitride material of which the Group III-nitride active layer 116 is composed. Other thicknesses may be used. For instance, the Group III-nitride active layer 116 may have any countable number of monolayers of a Group III-nitride material of which the Group III-nitride active layer 116 is composed.

In some cases, at least one of the pair of Group III-nitride barrier layers 114 has a nitride surface adjacent to one of the active regions 116. For instance, the nitride surface of the barrier layer 114 on which the active layer 116 is grown is free of a Group III element of which the pair of Group III-nitride barrier layers 114 are composed.

Each Group III-nitride barrier layer 114 of each pair of Group III-nitride barrier layers 14 may have a thickness that corresponds with a countable number of monolayers of a Group III-nitride material of which the Group III-nitride barrier layers 114 are composed. A variety of thicknesses may be used, as described below.

In one example, the quantum heterostructure 112 of each structure 100 is grown on an n-type Si wafer using a Veeco GEN II MBE system equipped with a radio frequency plasma-assisted nitrogen source. Prior to loading into the MBE system, the Si wafer may be cleaned in buffered hydrofluoric acid solution. Si-doped GaN nanowires with a length of about 100 nm are first grown directly on the Si substrate. The GaN nanowires serve as a template or other base (e.g., the base 106) for the subsequent epitaxy of the quantum heterostructures 112 (e.g., AlN/GaN quantum heterostructures). Si-doped AlN nanowire segments (e.g., about 150 nm in length) may then be grown at a substrate temperature of 875° C. to form the lower Group III-nitride charge carrier injection layer 108.

In this example, three pairs or periods of GaN/AlN quantum heterostructures may then be grown at the same substrate temperature of 875° C. Additional or fewer pairs or periods may be included. Each quantum heterostructure period may be considered to present a quantum disk. The thickness of each quantum disk (e.g., GaN quantum disk) may be, for example, one or two monolayers. In this case, the thickness of each barrier layer 114 (e.g., AlN barrier) was about 10 nm, but other thicknesses may be used. The growth rate was about 0.1 monolayer per second.

The growth of the quantum heterostructures is performed under N-rich conditions. In one example, the nominal Ga/N ratio may be about 0.29 and Al/N ratio may be about 0.26 during the active region growth. Because of the strong preference of Al incorporation over Ga, an Al-free surface is useful for the controlled formation of monolayer GaN in the AlN matrix. Therefore, at the end of each AlN barrier growth, the Al shutter is closed, e.g., for about 10 minutes. During that time period, only the nitrogen shutter is open, such that any extra Al atoms at the growth front are consumed. Then the Ga shutter is opened briefly for formation of the monolayer(s), which are then immediately capped by an AlN barrier. The thickness of the GaN quantum disks may vary from one to two monolayers by varying the Ga shutter opening time. Subsequently, a Mg-doped p-AlN hole-injection layer (e.g., of about 40 nm) and a p-GaN contact layer (e.g., of about ~40 nm) may then be grown.

FIG. 1 also shows a scanning electron microscopy (SEM) image 102 of the as-grown nanowire heterostructures. In this example, the nanowire array has a density of about $2 \times 10^{10}$ cm$^{-2}$. The nanowires are vertically aligned to the substrate and have N-polarity. For transmission electron microscopy (TEM), GaN/AlN nanowires were mechanically removed from the substrate and dispersed on a lacy carbon film mesh Cu TEM grid.

Transmission electron micrographs of the nanowire-based heterostructures were collected using a JEOL JEM3100R05 TEM with double aberration correctors operated in STEM mode with settings defining a probes size smaller than 0.1 nm for high-angle annular dark-field (HAADF) imaging with a detector collection inner angle of about 79 mrad.

Figure 2:
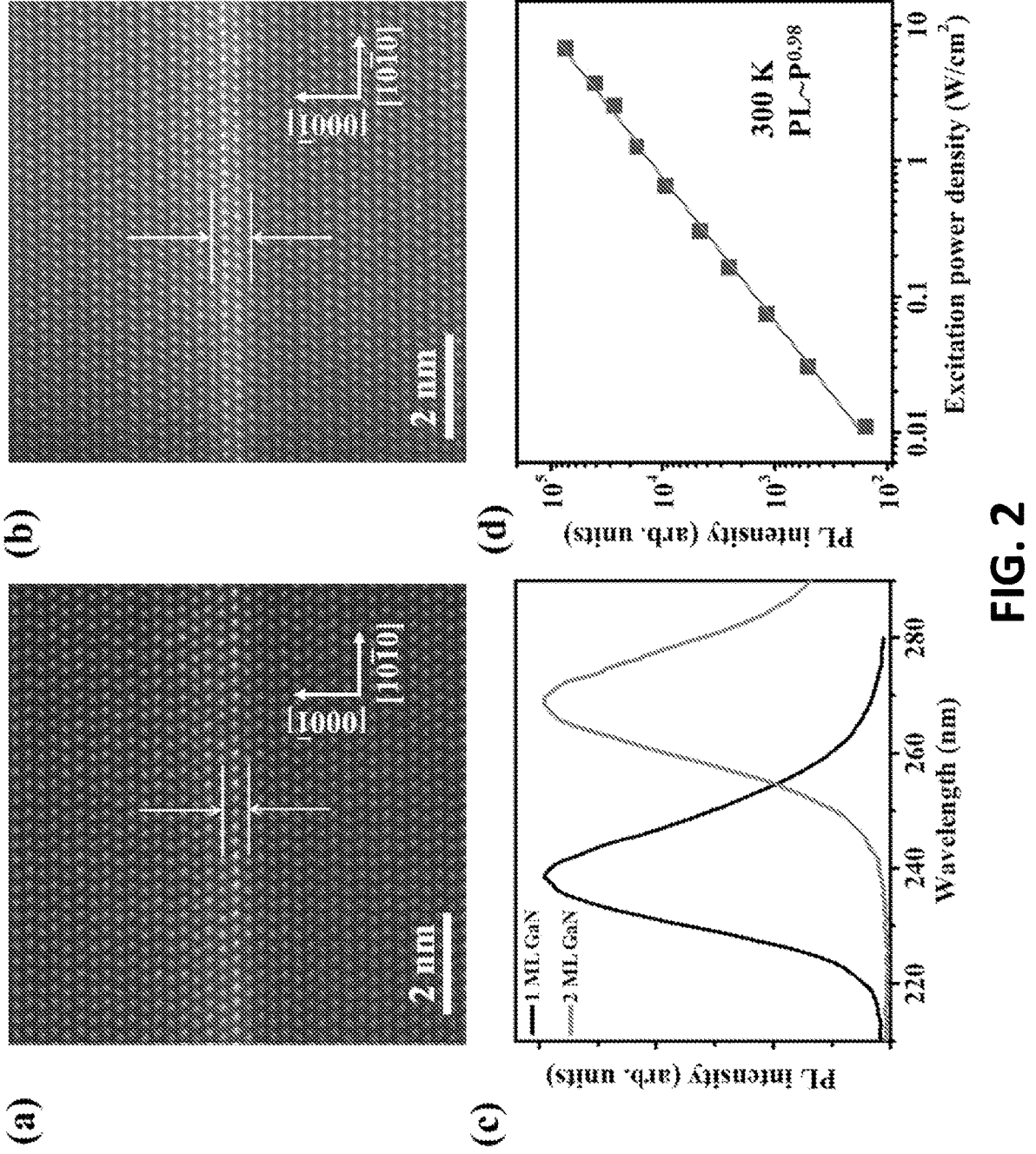
FIG. 2 depicts images of example nanowire arrays with monolayer and double monolayer (or bilayer) excitonic heterostructures, as well as graphical plots of photoluminescence (PL) spectra of such heterostructures and variations in the PL intensity of the monolayer heterostructure as a function of excitation power density.

FIG. 2 depicts the STEM-HAADF images of a single GaN monolayer example in Part (a), and a two GaN monolayer example in Part (b). In each example, the monolayer(s) was embedded in an AlN matrix. The HAADF-STEM images of the single and double monolayer GaN examples confirmed the formation of monolayer GaN on the c-plane of the AlN nanowire. A sharp interface was observed between the GaN monolayer and the bottom of the AlN barrier, while there was slight interdiffusion between the GaN monolayer and the top AlN barrier. The interdiffusion may be caused by the non-optimum Ga deposition time for nanowires with different sizes.

FIG. 2 also depicts the normalized photoluminescence (PL) spectra for the single monolayer example ("1 ML GaN") and the two monolayer example ("2 ML GaN"). The spectra were measured at room temperature. Variations of the integrated PL intensity with excitation power for the sample containing monolayer GaN active region are also shown. The PL properties of the monolayer GaN/AlN heterostructures were measured using a 193 nm ArF excimer laser as the excitation source at room temperature. As shown in Part (c) of FIG. 2, distinct emission peaks at 238 nm and 270 nm were exhibited for the single and double monolayer GaN examples, respectively, in good agreement with theoretical calculations. Significant inhomogeneous broadening (full-width-at-half-maximum of about 20 nm) was also exhibited, which is largely due to the size dispersion of the AlN nanowires and the resulting variations in strain distribution. Significantly reduced spectral broadening may be achieved with the use of selective area epitaxy to precisely control the size of the AlN nanowires.

While identifying genuine exciton contributions directly from PL spectra involves a sophisticated quantitative analysis, temporally and spectrally integrated PL determines the total number of radiatively recombined electron-hole pairs, which may then be used to determine the ratio of radiative and nonradiative Auger recombination. As shown in Part (d) of FIG. 2, the temporarily and spectrally integrated PL intensity (IPL) from the monolayer GaN is found to linearly increase with the excitation intensity ($I_0$), i.e., $I_{PL} \propto I_0$. This implies that the number of generated charge carriers ($\propto I_0$) is equal to radiatively recombined charge carriers ($\propto I_{PL}$). Because Auger recombination would invalidate this balance, the linear relationship between $I_{PL}$ and $I_0$ suggests strong suppression of Auger recombination under the presented measurement conditions, as expected for exciton-dominated systems.

Figure 3:
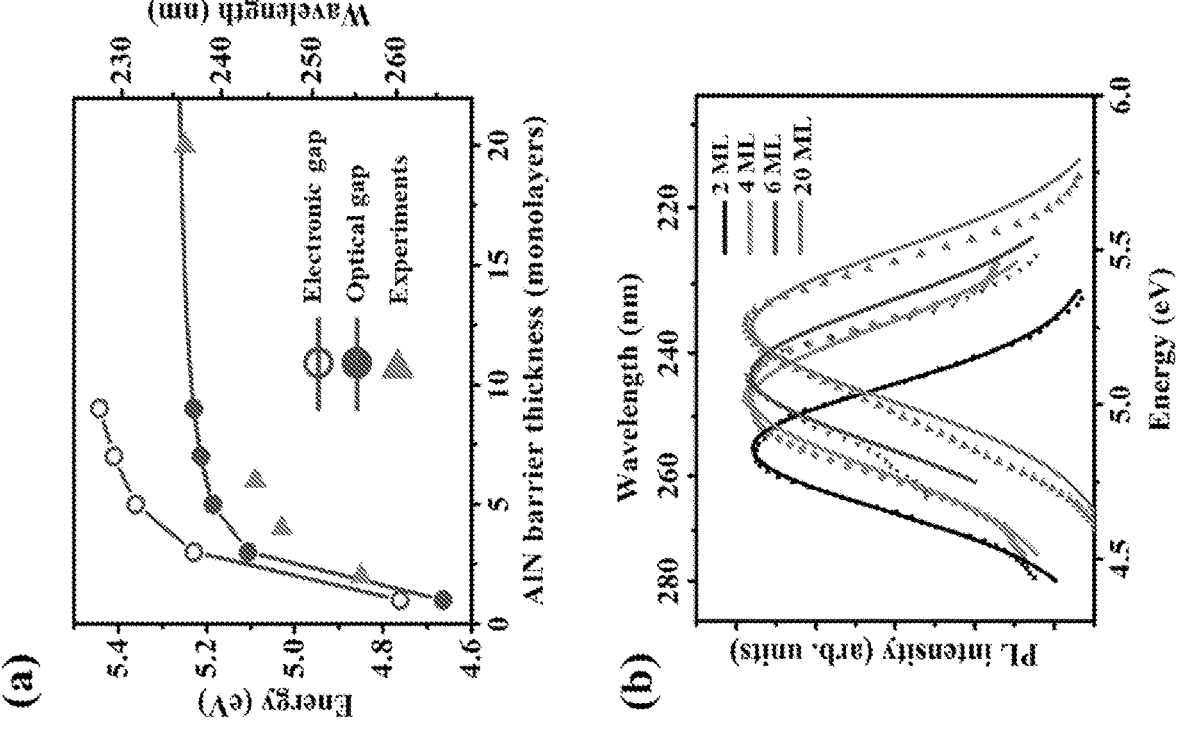
FIG. 3 depicts graphical plots of electronic and optical bandgaps of monolayer excitonic heterostructures as a function of barrier thickness, as well as PL spectra of monolayer excitonic heterostructures for a variety of barrier thicknesses.

Turning to FIG. 3, the experimental data is compared with theoretical predictions from first-principles calculations based on density functional and many-body perturbation theory, which yields accurate electronic and optical properties of materials. The theoretical electronic and optical gaps of monolayer GaN/AlN heterostructures with different AlN barrier thicknesses are shown in Part (a) of FIG. 3. Increasing the thickness of the AlN barrier, the electronic gap increases to 5.44 eV and the optical gap increases to 5.2 eV for monolayer GaN embedded in nine monolayers of AlN due to increased quantum confinement inside the GaN quantum disks. Thicker AlN barriers increase the electronic gap and optical gap only slightly above this value. At the other extreme, the structure of alternating GaN and AlN single monolayers has an optical gap of 4.66 eV.

Experimentally, a series of GaN/AlN heterostructures with monolayer-thick GaN and various AlN barrier thicknesses were grown. The PL spectra measured at room temperature are shown in Part (b) of FIG. 3 for AlN barrier thicknesses of 2, 4, 6 and 20 monolayers ("ML"). The observed PL peak positions, shown as triangles in Part(a) of FIG. 3, are in good agreement with the calculated optical gaps. For instance, the measured PL peaks are clearly below the electronic gap, verifying that the measured deep UV emission of the monolayer GaN is excitonic. In comparison with the calculated electronic bandgap, an exciton binding energy of about 200 meV is derived for the monolayer GaN embedded in an AlN matrix, which is nearly ten times higher than that in bulk GaN. Such a large excitonic binding energy was not measured in previously reported GaN/AlN planar structures, which may have been due to the surface/interface roughness and the presence of large densities of defects and dislocations.

In the examples of FIG. 3, the PL peaks were measured at 300 K. Lines connected to and extrapolated from the theory data points are used as guides for ease in illustration. FIG. 3 also depicts the normalized PL spectra of monolayer GaN with different AlN barrier thicknesses measured at room temperature. The solid lines are fittings to the experimental data.

Figure 4:
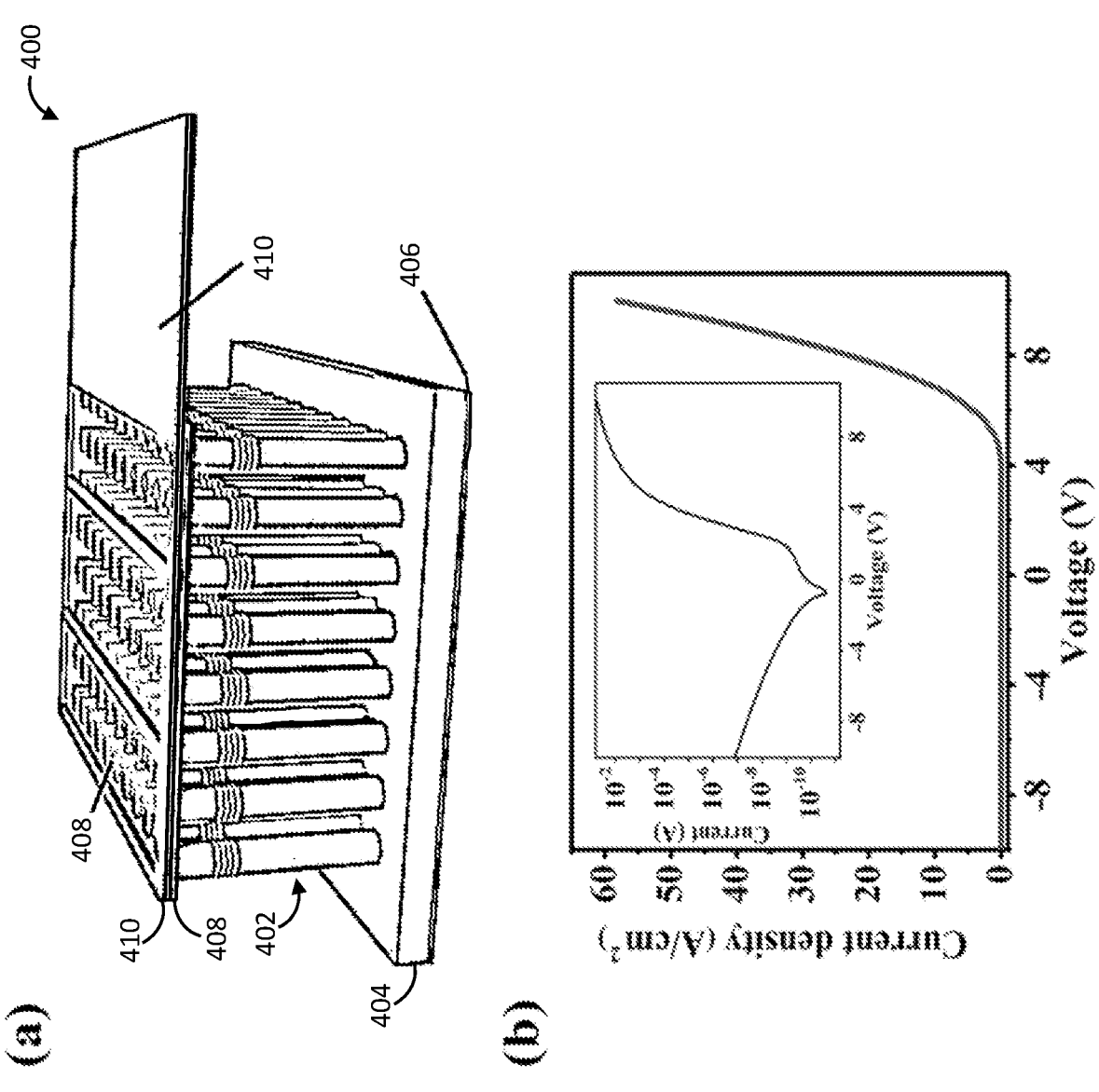
FIG. 4 depicts a schematic, perspective view of an ultraviolet (UV) light emitting diode (LED) device having a nanowire array with excitonic heterostructures in accordance with one example, as well as a graphical plot of the current-voltage (I-V) characteristic of the UV LED device.

FIG. 4 schematically illustrates the fabrication of a large area monolayer Group III-nitride (e.g., GaN) deep UV LED device 400. As shown in Part (a) of FIG. 4, the device 400 may include a plurality (e.g., array) of structures 402 supported by a substrate 404. Each structure 402 includes a Group III-nitride excitonic quantum heterostructure as described herein. Part (b) of FIG. 4 depicts a graphical plot of current-voltage (I-V) characteristics of the UV LED device 400 measured at room temperature. The inset of the graphical plot is plotted on a logarithmic scale.

The monolayer GaN deep UV LED device 400 may be fabricated using standard optical lithography and contact metallization techniques. A composite metal layer 406 is deposited on the backside of the substrate 404 (e.g., Si substrate). In some cases, the composite metal layer 406 is composed of, or otherwise includes, of constituent layers of Ti (e.g., 80 nm) and Au (e.g., 20 nm). The composite layer 406 serves as the n-metal contact. A p-Metal contact is provided by a composite layer 408. In some cases, the composite layer 408 is composed of, or otherwise includes, constituent layers of Ni (e.g., 10 nm) and Au (e.g., 10 nm). The composite layer 408 may be deposited using a tilting angle deposition technique, which also defines the device area. Subsequently, a metal grid contact 410 may be deposited on the device top surface to facilitate current spreading and injection. The metal grid contact 410 may also be a composite metal layer, including, for instance, constituent layers of Ti (e.g., 20 nm), Al (e.g., 300 nm), and Au (e.g., 20 nm). Alternative or additional constituent metal layers may be used in any of the aforementioned composite layers. The device areal sizes may fall in the range of 300 $\mu$m$\times$300 $\mu$m to 1 mm$\times$1 mm.

The current-voltage characteristics were measured at room temperature, and exhibit a turn-on voltage of around 5 V. The device leakage current is on the order of a few hundred nA for a reverse bias of $-10$ V, as shown in the inset of Part (b) of FIG. 4. The excellent electrical performance is due to the efficient p-type conduction of Mg-doped AlN nanocrystals. The formation energy of Al-substitutional Mg acceptors is drastically reduced in AlN nanostructures compared to epilayers, due to the efficient surface stress relaxation. The resulting significantly enhanced Mg-dopant incorporation, together with the reduced N-vacancy formation under N-rich epitaxy conditions, enables the formation of an Mg-impurity band in AlN, which can lead to hole hopping conduction. Moreover, due to the dispersion of Mg acceptors, a portion of Mg acceptors has significantly reduced activation energy. As shown in the graphical plot, the current density exceeds 50 A/cm$^2$ at 10 V at room temperature.

Figure 5:
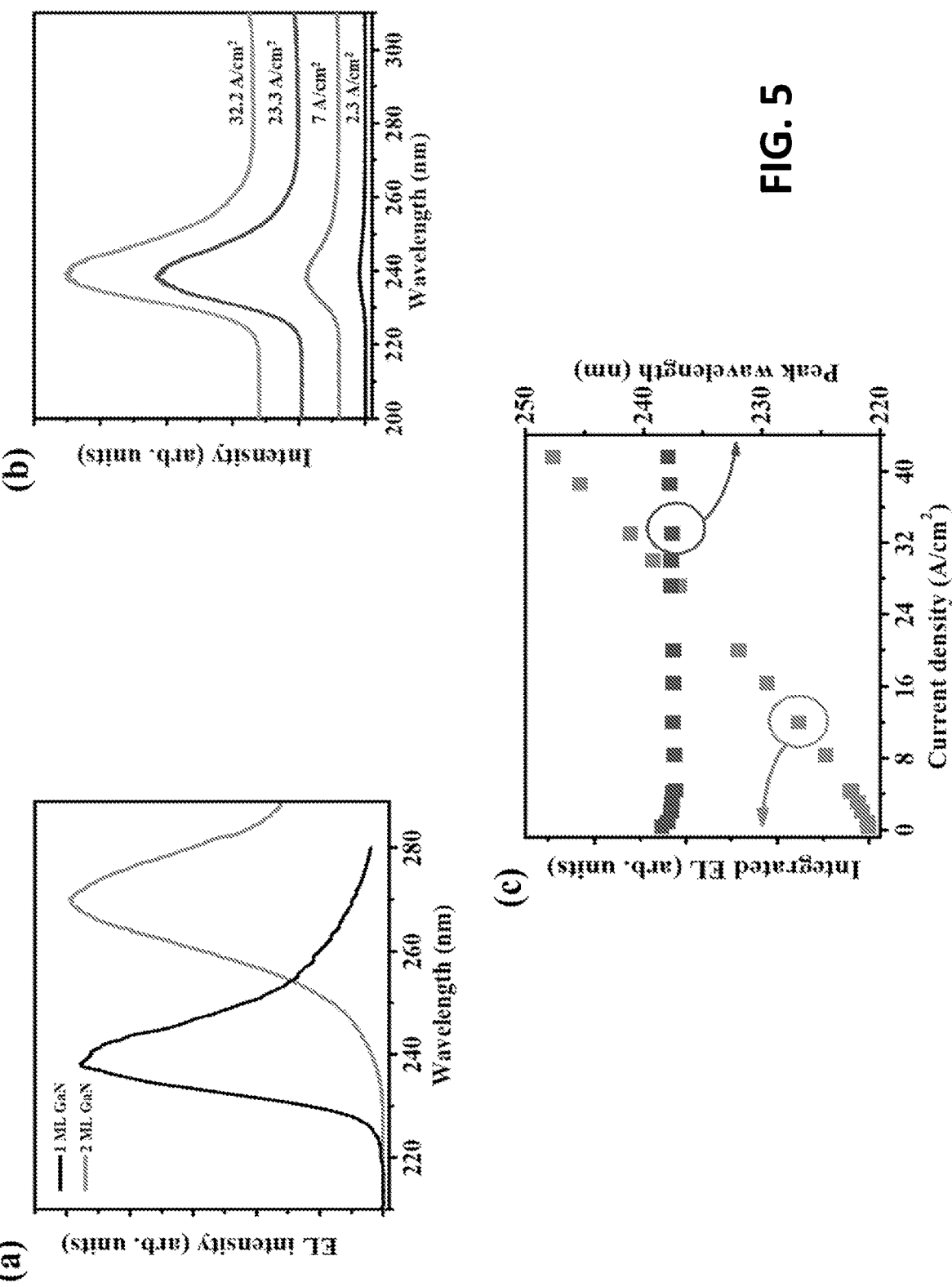
FIG. 5 depicts graphical plots of electroluminescence (EL) spectra of example UV LED devices having a nanowire array with excitonic heterostructures, including EL spectra and intensities of a UV LED device with monolayer heterostructures at various injection current levels or densities.

FIG. 5 depicts, in Part (a), a graphical plot of electroluminescence (EL) spectra measured from one monolayer ("1 ML GaN") and two monolayers ("2 ML GaN") GaN LEDs, respectively. In Part (b) of FIG. 5, a graphical plot of electroluminescence spectra measured under injection currents from 2.3 A/cm$^2$ to 32.2 A/cm$^2$ for a monolayer GaN LED device is depicted. In Part (c) of FIG. 5, a graphical plot depicts variations of the integrated electroluminescence intensity and peak position versus injection current. In these examples, the measured device size is 300 $\mu$m$\times$300 $\mu$m.

The electroluminescence (EL) spectra for the LED devices incorporating single and double monolayer GaN active regions had peak emission at 238 nm and 270 nm, respectively. The peak emissions are consistent with the PL measurements shown in Part (c) of FIG. 2. The EL spectra for the monolayer GaN deep UV LED device measured under different injection currents are further shown in Part (b) of FIG. 5. The peak positions remain nearly constant as a function of current, as shown in Part (c) of FIG. 5, which is attributed to the negligible quantum-confined Stark effect. The extreme quantum-confinement of electrons and holes in an atomically thin GaN active region prevents the separation of electron and hole wavefunction, despite the large polarization field between GaN and AlN. The integrated EL intensity increases nearly linearly with current. Analysis of the relative external quantum efficiency versus injection current further shows negligible efficiency droop. This is in direct contrast to the severe efficiency droop measured in conventional AlGaN LEDs. In monolayer GaN LEDs, because the strong exciton binding energy enhances radiative decay and quenches scattering, the radiative carrier lifetime is reduced and thus effective carrier density. As a consequence, Auger recombination and electron overflow induced droop in deep UV devices can be suppressed in strongly excitonic systems.

Figure 6:
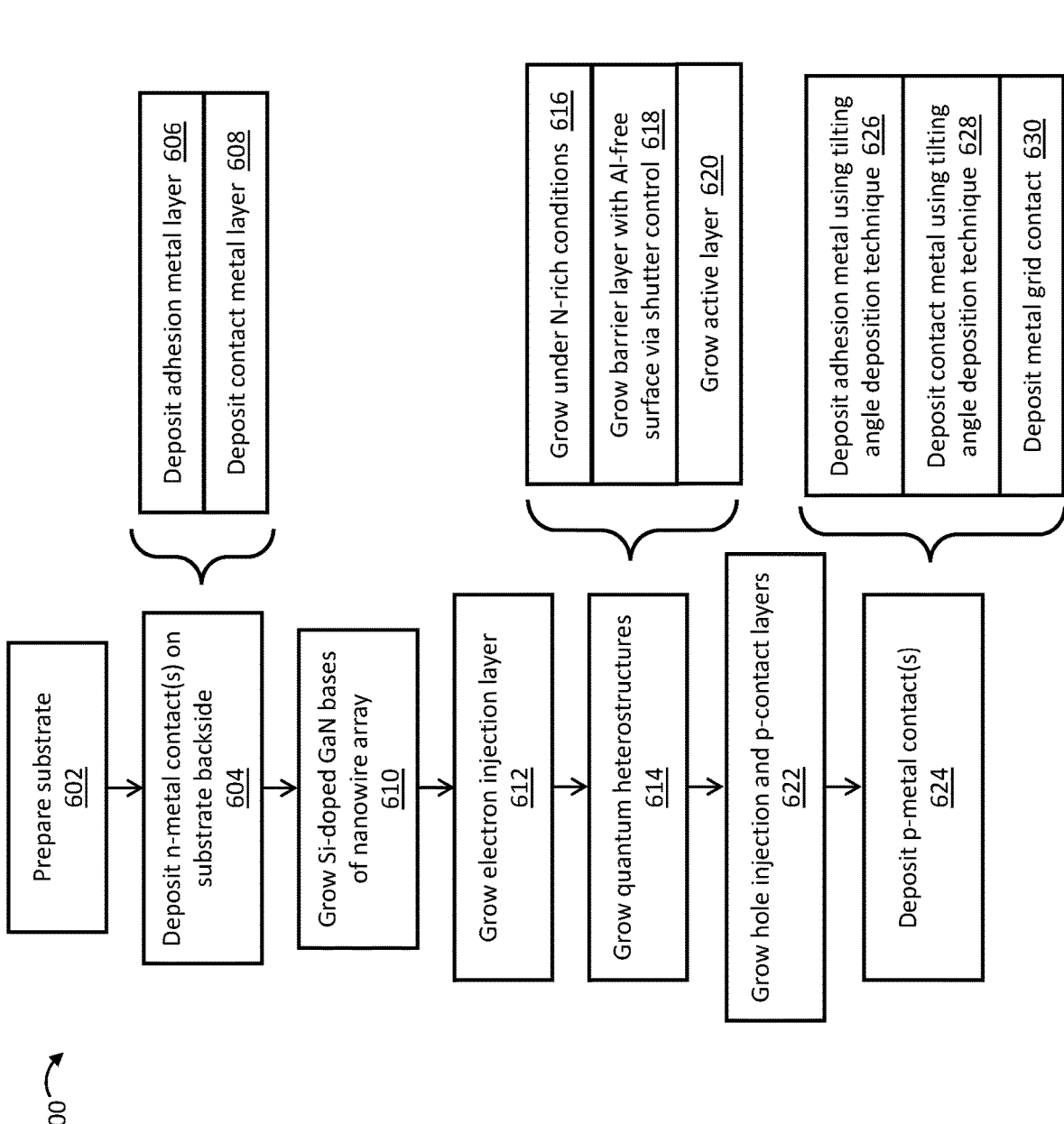
FIG. 6 is a method of fabricating a nanowire-based device with an excitonic heterostructure in accordance with one example.

FIG. 6 depicts a method 600 of fabricating an excitonic device in accordance with one example. The method 600 may be used to manufacture any type of excitonic device described herein or another type of excitonic device. The method 600 may include additional, fewer, or alternative acts. For instance, the method 600 may or may not include one or more acts directed to preparing a substrate (act 602).

The method 600 may begin with an act 602 in which a substrate is prepared. The substrate may be or be formed from a n-type silicon (Si) wafer. Other semiconductors and substrates may be used. Preparation of the substrate may include one or more thermal diffusion or other doping procedures. In some cases, the act 602 may include one or more doping procedures to establish one or more n-type layers or regions.

In an act 604, one or more n-metal contacts are deposited on a backside of the substrate. In some cases, the act 604 includes deposition of an adhesion metal layer (act 606) and a contact metal later (act 608).

The method 600 includes an act 610 in which Group III-nitride bases of an array of structures are grown on the substrate. The structures may be nanowires or other nanostructures. The act 610 may include implementation of a plasma-assisted molecular beam epitaxy procedure. The procedure may be implemented under nitrogen-rich conditions. In one example, the growth conditions are as follows: a growth temperature of 790° C. for 1.5 h, a Ga beam equivalent pressure of ~6$\times$10$^{-8}$ Torr, a nitrogen flow rate of 1 standard cubic centimeter per minute (sccm), and a plasma power of 350 W. The nanowires provide platforms or other structures for the heterostructures formed in the following steps. Other platforms or structures may be formed. For instance, the structures may be microstructures.

A Group III-nitride charge carrier injection layer is then grown on each Group III-nitride base of the array of nanostructures in an act 612. The injection layer may be doped (e.g., Si-doped) for injection of electrons.

In an act 614, a quantum heterostructure is grown on each first Group III-nitride charge carrier injection layer of the array of nanostructures. The quantum heterostructures may be grown under Nitrogen-rich conditions (act 616). The act 614 includes growing a Group III-nitride barrier layer with a nitride surface (act 618), and growing a Group III-nitride active layer on the nitride surface (620). Additional active layers, and surrounding barrier layers, may be grown. The Group III-nitride active layer has a thickness for quantum confinement of charge carriers as described herein.

As described above, growing the Group III-nitride barrier layer with the nitride surface may include closing, at an end of a growth period, a shutter for a Group III material (e.g., Al) while leaving a shutter for nitrogen open for a length of time to consume extra Group III atoms at the surface of the Group III-nitride barrier layer. In some cases, the Al shutter may be closed for about 10 minutes. The time period length may vary. For instance, the length of time may be on the order of minutes, or longer.

In an act 622, a second Group III-nitride charge carrier injection layer is grown on each quantum heterostructure of the array of the nanostructures. The second charge carrier injection layer may be doped (e.g., Mg-doped) to act as a hole injection layer. The act 622 may also include growing a p-contact layer on each charge carrier injection layer.

The method 600 may further include depositing one or more metal contacts on the nanostructures in an act 624. In some cases, the act 624 includes acts 626 and 628 in which adhesion and contact metal layers are deposited using a tilting angle deposition procedure. Alternatively or additionally, a metal grid contact is deposited in an act 630.

As described herein, excitonic devices may be realized via the controlled epitaxy of monolayer GaN in an AlN matrix. Experimental studies and direct correlation with first-principles calculations based on density functional and many-body perturbation theory provide clear evidence that monolayer GaN is capable of exhibiting strong excitonic luminescence, with an exciton binding energy exceeding 200 meV. The emission wavelengths may be tuned by varying the thicknesses of GaN and/or AlN barrier. Deep UV LED devices with the incorporation of single and double monolayer GaN may operate at 238 and 270 nm, respectively. These unique deep UV LED devices exhibit highly stable emission and negligible efficiency droop.

In other examples, selective area epitaxy may be used. The controlled epitaxy of monolayer GaN in AlN nanocrystals grown by selective area epitaxy may significantly reduce the inhomogeneous broadening. Deep UV LED devices with high power operation may therefore be realized.

The present disclosure has been described with reference to specific examples that are intended to be illustrative only and not to be limiting of the disclosure. Changes, additions and/or deletions may be made to the examples without departing from the spirit and scope of the disclosure.

The foregoing description is given for clearness of understanding only, and no unnecessary limitations should be understood therefrom.

What is claimed is:

1. A device comprising:
a substrate; and
a plurality of nanostructures supported by the substrate, each nanostructure of the plurality of nanostructures comprising a Group III-nitride base, first and second Group III-nitride charge carrier injection layers supported by the Group III-nitride base, and an excitonic quantum heterostructure disposed between the first and second charge carrier injection layers;
wherein:
the excitonic quantum heterostructure comprises a pair of Group III-nitride barrier layers, and a Group III-nitride active layer disposed between the pair of Group III-nitride barrier layers,
the Group III-nitride active layer has a thickness for quantum confinement of charge carriers such that the Group III-nitride active layer is configured as a quantum disk,
at least one of the pair of Group III-nitride barrier layers has a nitride surface adjacent to the Group III-nitride active layer, and
the thickness of the Group III-nitride active layer is configured for excitonic charge carrier recombination.

2. The device of claim 1, wherein the nitride surface is free of a Group III element of which the pair of Group III-nitride barrier layers are composed.

3. The device of claim 1, wherein the thickness of the Group III-nitride active layer corresponds with a monolayer of a Group III-nitride material of which the Group III-nitride active layer is composed.

4. The device of claim 1, wherein the thickness of the Group III-nitride active layer corresponds with a bilayer of a Group III-nitride material of which the Group III-nitride active layer is composed.

5. The device of claim 1, wherein the Group III-nitride active layer has a countable number of monolayers of a Group III-nitride material of which the Group III-nitride active layer is composed.

6. The device of claim 1, wherein the excitonic quantum heterostructure further comprises:
a further Group III-nitride barrier layer; and
a further Group III-nitride active layer disposed between the further Group III-nitride barrier layer and one of the pair of Group III-nitride barrier layers.

7. The device of claim 1, wherein each Group III-nitride barrier layer of the pair of Group III-nitride barrier layers has a thickness that corresponds with a countable number of monolayers of a Group III-nitride material of which the pair of Group III-nitride barrier layers is composed.

8. The device of claim 1, wherein the Group III-nitride active layer comprises gallium nitride.

9. The device of claim 1, wherein the pair of Group III-nitride barrier layers comprise aluminum nitride.

10. The device of claim 1, wherein the first and second Group III-nitride charge carrier injection layers comprise silicon-doped aluminum nitride and magnesium-doped aluminum nitride, respectively.

11. The device of claim 1, wherein the Group III-nitride base comprises gallium nitride.

12. The device of claim 1, wherein each nanostructure of the plurality of nanostructures comprises a nanowire oriented perpendicularly to the substrate.

13. The device of claim 1, wherein the substrate comprises silicon.

* * * * *